United States Patent
Poland et al.

(10) Patent No.: US 11,336,104 B2
(45) Date of Patent: May 17, 2022

(54) METHOD OF PERFORMING A STATE OF HEALTH ESTIMATION FOR A RECHARGEABLE BATTERY ENERGY STORAGE SYSTEM

(71) Applicants: ABB Schweiz AG, Baden (CH); Hitachi Energy Switzerland AG, Baden (CH)

(72) Inventors: Jan Poland, Nussbaumen (CH); Daniel Chartouni, Wettingen (CH); Alexandre Oudalov, Fislisbach (CH); James Ottewill, Cracow (PL); Erald Pjetri, Cracow (PL)

(73) Assignee: Hitachi Energy Switzerland AG, Baden (CH)

( * ) Notice: Subject to any disclaimer, the term of this patent is extended or adjusted under 35 U.S.C. 154(b) by 105 days.

(21) Appl. No.: 16/987,803

(22) Filed: Aug. 7, 2020

(65) Prior Publication Data
US 2021/0044119 A1 Feb. 11, 2021

(30) Foreign Application Priority Data
Aug. 8, 2019 (EP) .................................... 19190884

(51) Int. Cl.
*H02J 7/00* (2006.01)
*H02J 7/14* (2006.01)
*G01R 31/392* (2019.01)
*B60L 58/16* (2019.01)

(52) U.S. Cl.
CPC ............. *H02J 7/005* (2020.01); *B60L 58/16* (2019.02); *G01R 31/392* (2019.01); *H02J 7/0024* (2013.01)

(58) Field of Classification Search
USPC ........................................................ 320/126
See application file for complete search history.

(56) References Cited

U.S. PATENT DOCUMENTS

| | | | | |
|---|---|---|---|---|
| 5,898,282 | A * | 4/1999 | Drozdz | B60L 50/61 318/139 |
| 9,496,730 | B2 * | 11/2016 | Gallegos | B60L 50/40 |
| 10,393,621 | B2 * | 8/2019 | Jaramillo-Velasques | G05B 23/0221 |
| 2010/0039116 | A1 | 2/2010 | Tsenter et al. | |
| 2011/0193528 | A1 | 8/2011 | Huggins | |
| 2012/0293130 | A1 | 11/2012 | Burstein et al. | |

(Continued)

FOREIGN PATENT DOCUMENTS

| | | |
|---|---|---|
| CN | 110048176 A | 7/2019 |
| DE | 102014210010 A1 | 11/2015 |

*Primary Examiner* — Alexis B Pacheco
(74) *Attorney, Agent, or Firm* — Slater Matsil, LLP

(57) ABSTRACT

A method can be used to perform a state of health (SoH) estimation for a rechargeable battery energy storage system during operation of the rechargeable battery energy storage system. The rechargeable battery energy storage system includes a plurality of parallel strings that are individually controllable. The method includes selecting at least one string from the plurality of parallel strings, placing the selected at least one string into a SoH calibration mode for performing a SoH calibration while concurrently maintaining at least one other string of the plurality of parallel strings in operative mode, and causing the selected at least one string to return to the operative mode after the SoH calibration has been completed for the selected at least one string.

21 Claims, 9 Drawing Sheets

(56) References Cited

U.S. PATENT DOCUMENTS

| | | | |
|---|---|---|---|
| 2014/0015488 A1* | 1/2014 | Despesse | H01M 10/425 |
| | | | 320/122 |
| 2016/0370433 A1 | 12/2016 | Chazal et al. | |
| 2017/0033410 A1 | 2/2017 | Tohara et al. | |
| 2017/0077706 A1 | 3/2017 | Triebel et al. | |
| 2018/0170207 A1* | 6/2018 | Ko | H02J 7/008 |
| 2018/0212213 A1* | 7/2018 | Kawai | H01M 10/0525 |
| 2018/0257507 A1* | 9/2018 | Kawai | B60L 58/20 |
| 2019/0245381 A1* | 8/2019 | Sole | H02J 13/00 |
| 2019/0389314 A1* | 12/2019 | Zhu | B60L 53/11 |
| 2020/0282861 A1* | 9/2020 | Kim | H02J 7/0014 |

* cited by examiner

METHOD OF PERFORMING A STATE OF HEALTH ESTIMATION FOR A RECHARGEABLE BATTERY ENERGY STORAGE SYSTEM

CROSS-REFERENCE TO RELATED APPLICATIONS

This application claims the benefit of European Application No. 19190884.7, filed on Aug. 8, 2019, which application is hereby incorporated herein by reference.

TECHNICAL FIELD

The disclosure relates to a method of performing a state of health estimation for a rechargeable battery energy storage system.

BACKGROUND

Battery energy storage systems (BESSs) are considered to be an important contributor to stability of future power grids with a significant fraction of renewable energy, but also to clean e-mobility. Batteries degrade over time. Hence, an important quantity to monitor is a State of Health (SoH). The SoH may be characterized one or several key performance indicators (KPIs). The KPIs may be maximum remaining capacity and internal resistance. Specifically, SoH may provide a measure of the current capacity and internal resistance of a battery relative to the values of the same respective parameters of the battery when it is new. It is an important indicator in determining the capability of a battery to store and deliver energy. It is often also considered as a measure of the degradation of the battery used in determining when a battery has reached its end of life. Hence, SoH can have implications both in the proper control and maintenance of the battery system.

Conventionally, accurate estimation of the BESS SoH requires operating the battery in a specific way, namely, starting at a specific state of charge, a specific current profile should be applied both in charge and discharge directions, until certain cutoff voltages are met. This is referred to as SoH calibration cycle. The SoC range covered hereby should be as large as possible, in order to maximize accuracy. Conventionally, performing such a SoH calibration cycle temporarily takes the whole BESS out of operation. In certain critical applications, this can have significant impact on the capability of the energy storage system to provide ancillary services (e.g., frequency stabilization, load regulation, voltage support, etc.), which in turn can impact the reliability of the system to which they are connected. In order to estimate the SoH of a large BESS, it is today taken offline for a couple of hours, while one or several SoH calibration cycles are applied. This adds to the operation costs.

Methods for estimating the SoH online using operational data rather than data recorded during a calibration cycle (e.g., based on least squares methods, artificial neural networks and Kalman filters and their variants) can be less accurate than full discharge cycles necessary for achieving accurate estimation. For illustration, full discharge cycles occur infrequently, if at all, during normal operation, and the loading on the system is not consistent during the measurement cycle.

SoH calculations that also use online data and conventional dedicated SoH for the entire BESS provide a bulk measure of the state of health of the entire BESS system. Thus the resulting values can have insufficient accuracy, as they do not allow the SoH of individual strings to be assessed. Often the degradation is not equal for different strings of battery cells, as environmental conditions can differ in different locations of the BESS. For illustration, the location relative to Heating, Ventilation, & Air Conditioning (HVAC) and/or relative to the outer walls or doors of a BESS container may be different for different strings. Determining the SoH only for all strings in combination limits the possibilities of performing advanced inhomogeneous operation of parallel strings of a BESS system. Further still, using existing approaches it is not possible to distinguish the degradation of individual strings of battery cells. This can lead to difficulties in establishing the root cause of reduced capacity or failure in a BESS system, which in turn can lead to maintenance being performed inefficiently.

A. Oudalov et al., "Optimizing a Battery Energy Storage System for Primary Frequency Control," IEEE Transactions on Power Systems, vol. 22, no. 3, 2007 discloses a technique of increasing battery lifetime by avoiding high frequency charge-discharge sequences.

DE 10 2014 210 10 A1 discloses a method of operating an electrical energy storage system, which is connected to an electrical energy supply grid for providing a setpoint power and contains a plurality of storage units, which are electrically connected at a point of common coupling and among which the setpoint power is distributed. The total efficiency of the energy storage system is matched to the setpoint power by adjusting individual power components to be provided by the storage units.

Neither one of these documents addresses the need of performing SoH calibration cycles.

US 2016/0370433 A1 describes a method of gathering information relating to physical quantities in order to determine the state of ageing of each of the batteries from the plurality of batteries, selecting a battery from the plurality of batteries based on information gathered and/or information relating to a planning of the use of the batteries and/or a user instruction, during the energy storage phase, charging as a priority the selected battery until a predefined maximum charge level, dependent on the state of ageing, is reached, during the energy release phase, discharging as a priority the selected battery, if it has reached the maximum charge level during the storage phase, until a predefined minimum charge level, dependent on the state of ageing, is reached, or making the selected battery inactive if it has not yet reached the predefined maximum charge level, then measuring a level of energy yielded by the selected battery, calculating a residual capacity of the selected battery based on the measurement of the level of energy yielded by the battery.

US 2017/0033410 A1 describes a battery cabinet group including a plurality of battery cabinets each including a plurality of battery modules connected to each other. The battery module is a replacement unit. A deterioration inspecting block obtains a characteristic of each of the battery modules to inspect a deterioration status thereof. A numbering block numbers each of the battery modules in an order from a small deterioration to a large deterioration based on the characteristic obtained by the deterioration inspecting block. A re-arrangement determining block determines a re-arrangement position of each of the battery modules in such a way that numbers given by the numbering block are in sequence in the same battery cabinet.

US 2017/0033410 A1 aims at providing a secondary battery system and a method of arranging battery modules which are capable of recovering a system performance and maintaining the system, performance in the long term.

Various shortcomings are associated with such conventional techniques. For illustration, during the described information gathering process there is an increased risk that the battery system will be unable to deliver the desired energy upon demand. This may impact the availability of the BESS. This can also have a significant impact on the capability of the energy storage system to provide ancillary services (such as frequency response, load regulation, voltage support etc.), which in turn can impact the reliability of the system to which they are connected.

SUMMARY

The invention relates to methods and devices for performing a state of health (SoH) estimation for a rechargeable battery energy storage system. The invention relates in particular to methods and devices for performing an SoH estimation for a rechargeable battery energy storage system that comprises a plurality of parallel strings of battery cells.

Embodiments can provide improved devices and methods that mitigate at least some of the shortcomings of conventional techniques. For example, embodiments provide methods and devices that allow dedicated SoH calibration cycles to be performed for string(s) of a rechargeable battery energy storage system (BESS) without requiring the full BESS to be taken out of operation. Embodiments provide methods and devices that allow the SoH to be determined individually for each one of several strings of the BESS. These issues are not addressed in conventional systems as described above.

According to embodiments of the invention, at least one of a plurality of parallel strings of a BESS and is taken out of the normal operation for performing a SoH calibration. The SoH calibration of the at least one selected string may include one or several dedicated SoH cycles, in each of which the string is essentially completely charged and discharged (e.g., charged to 80% or more and discharged to 20% or less). The remaining strings that are not placed in a SoH calibration mode may serve the difference to the required load profile from the remaining strings. The risk that the battery system may be unable to deliver the desired energy upon demand may thus be mitigated or eliminated. The capability of the BESS to provide ancillary services (such as frequency response, load regulation, voltage support etc.) is not mitigated as in conventional approaches.

A method of performing SoH estimation for a rechargeable battery energy storage system during operation of the rechargeable battery energy storage system is provided. The rechargeable battery energy storage system comprises a plurality of parallel strings that are individually controllable. The method comprises selecting at least one string from the plurality of parallel strings. The method comprises placing the selected at least one string into a SoH calibration mode for performing a SoH calibration while concurrently maintaining at least one other string of the plurality of parallel strings in operative mode. The method comprises causing the selected at least one string to return to operative mode after the SoH calibration has been completed for the selected at least one string.

As used herein, the term "operative mode" is used to refer to an operation mode of a string in which the string contributes to the desired function of the BESS, which may be storing energy and/or providing energy, e.g., for providing ancillary services (such as stabilization or regulation purposes) or for other purposes.

Maintaining the at least one other string in the operative mode comprises using the at least one other string for storing energy that is supplied to a grid or at least one power consumer.

The method may comprise using the at least one other string in the operative mode to compensate for the fact that the selected at least one string is in the SoH calibration mode.

The method may comprise, in response to the selected at least one string being placed into the SoH calibration mode, increasing a current flow into or out of the at least one other string that is maintained in operative mode, so as to ensure that the BESS meets a required load profile. The required load profile may be a load profile that ensures that the BESS provides frequency stabilization, load regulation, and/or voltage support for a grid. The grid may be a national or regional grid or an islanded grid.

The method may comprise increasing the amount of current supplied to the at least one other string in the operative mode in response to the selected at least one string being placed into the SoH calibration mode, when energy is stored in the BESS.

The method may comprise increasing the amount of current supplied by the at least one other string in the operative mode in response to the selected at least one string being placed into the SoH calibration mode, when energy is provided by the BESS to a grid or consumer.

At any time during the SoH estimation, at least 50% of the total number of strings in the plurality of strings may be maintained in the operative mode.

At any time during the SoH estimation, at least 70% of the total number of strings in the plurality of strings may be maintained in the operative mode.

At any time during the SoH estimation, at least 80% of the total number of strings in the plurality of strings may be maintained in the operative mode.

At any time during the SoH estimation, at least 90% of the total number of strings in the plurality of strings may be maintained in the operative mode.

At any time during the SoH estimation, only one or two of the parallel strings may be concurrently placed in the SoH calibration mode.

The method may further comprise performing one or several SoH calibration cycles for the selected at least one string while the selected at least one string is in the SoH calibration mode and before the selected at least one string is caused to return to the operative mode.

The method may further comprise ranking and/or matching the plurality of parallel strings based on performance characteristics.

The performance characteristics may include a degradation indicator for each of the plurality of parallel strings.

The degradation indicator may be based on the SoH estimation results obtained in a preceding SoH estimation procedure, and/or based on current drawn from each of the plurality of parallel strings, e.g., while the plurality of parallel strings are disconnected from a grid.

Ranking the plurality of parallel strings may comprise establishing a sequence of the parallel strings that is dependent on the performance characteristics.

Matching the plurality of parallel strings may comprise identifying a plurality of pairs of strings. The identified pairs may be those strings that have performance characteristics that are most similar to each other, based on a metric. The identified pairs may be those strings for which a modulus of the difference in performance characteristics (e.g., the difference of a SoH quantifier or the difference in current drawn while the strings are disconnected from a grid) is less than a threshold or is minimized.

The steps of selecting the at least one string, placing the selected at least one string into the SoH calibration mode, and causing the selected at least one string to return to the operative mode may be performed successively for at least a sub-set of the plurality of parallel strings. The method may comprise repeated the steps of selecting one or several strings, placing the one or several strings into the SoH calibration mode, and causing the one or several strings into to return to operative mode until all of the parallel strings have been placed into the SoH calibration mode and SoH calibration has been performed.

The method may comprise determining an order in which strings are selected for SoH calibration.

The order may be determined based on the ranking. For illustration, the strings may be successively placed into the SoH calibration mode (one-by-one or in sets of two or more strings) in an order that is determined by the performance characteristics.

The order may be determined based on the matching. For illustration, the strings may be successively placed into the SoH calibration mode, such that pairs of strings identified based on the performance characteristics are concurrently placed into the SoH calibration mode.

Selecting at least one string may comprise selecting a first string and selecting a second string, wherein, during at least part of the SoH calibration, the second string acts as an energy sink for energy discharged from the first string.

Placing the selected at least one string into the SoH calibration mode may comprise controlling a power flow through a converter that is interconnected between the selected at least one string and a point of common coupling in accordance with a calibration load profile.

The converter connected to the selected at least one string may be controlled in accordance with the calibration load profile and independently of a load profile of the BESS towards the grid or consumer connected to the point of common coupling.

Power flows through converters interconnected between the at least one other string maintained in the operative mode may be controlled such that the power flows are dependent on the load profile of the BESS towards the grid or consumer connected to the point of common coupling and, optionally, also the calibration load profile of the selected at least one string that is placed into the SoH calibration mode.

Placing the selected at least one string into the SoH calibration mode may comprise disconnecting the selected at least one string from a point of common coupling and temporarily connecting the selected at least one string to a SoH cycle energy source and/or energy sink.

The SoH cycle energy source and/or energy sink may be disconnected from a point of common coupling of the plurality of parallel strings at least during the SoH calibration.

The SoH cycle energy source may be a dedicated SoH energy source used only for SoH calibration.

The SoH cycle energy source and/or energy sink may be another one of the strings.

Cells of the selected at least one string may be charged and/or discharged in accordance with a calibration load profile during the SoH calibration.

The calibration load profile may be predetermined or operator-defined.

The calibration load profile used for charging and/or discharging the selected at least one string during SoH calibration may be independent of the load of the remaining at least one other string that concurrently remains in the operative mode. For illustration, the calibration load profile used for charging and/or discharging the selected at least one string during SoH calibration may be independent of the rate at which energy is concurrently stored (e.g., from a grid or a local energy source, such as a renewable energy source) in the at least one other string that is operated in the operative mode. The calibration load profile used for charging and/or discharging the selected at least one string during SoH calibration may be independent of the rate at which energy is concurrently provided (e.g., to a grid or consumer) by the at least one other string that is operated in the operative mode.

The selected at least one string is charged to a first level that exceeds a first threshold and is discharged to a second level that is less than a second threshold during each successive SoH calibration cycle performed during the SoH calibration.

The first threshold may be 80% or more, 90% or more, 95% or more, or 97% or more.

The second threshold may be 20% or less, 10% or less, 5% or less, or 3% or less.

A SoH calibration cycle performed during the SoH calibration may involve charging and discharging a string over an interval from 20% or less to 80% or more, from 10% or less to 90% or more, from 5% or less to 95% or more, or from 3% or less to 97% or more of its nominal capacity.

Maintaining the at least one other string in the operative mode may comprise maintaining all strings of the plurality of parallel strings except for the selected at least one string in the operative mode.

The BESS may provide at least one ancillary service to a grid.

The at least one ancillary service may be selected from a group consisting of frequency response, load regulation, and voltage support.

The method may comprise automatically determining a time at which the SoH estimation is to be initiated.

The time at which the SoH estimation is to be initiated may be determined based on historical load profiles of the BESS. The time at which the SoH estimation is to be initiated may be determined based on a priori information for the load profile of the BESS.

Performing the SoH calibration of a selected string may respectively comprise determining several parameters defined by an equivalent circuit model (ECM) of the selected at least one string or each cell of the selected at least one string.

The several parameters may be determined independently of the state of charge (SoC) estimates of a battery management system (BMS).

The several parameters may comprise an internal resistance.

The several parameters may comprise several internal resistances.

The several parameters may comprise information on a relative capacity of two capacitances in the ECM.

The relative capacity may include a quotient of the two capacitances.

The several parameters may be determined using an iterative procedure. Each iteration may include a combined state and parameter estimation.

The iterative procedure may use a measured cell open circuit voltage (OCV) as input.

The estimation of the several parameters of the ECM in each iteration may be based on a Python Optimization Modeling Objects (Pyomo) model.

The plurality of parallel strings may form a stationary battery energy storage system, BESS.

The plurality of parallel strings may be installed onboard a vehicle.

Each string of the plurality of parallel strings may comprise a plurality of cells.

The cells may be Li ion cells, without being limited thereto.

The method may be performed by a control device.

The method may be performed automatically by the control device.

The control device may include at least one integrated semiconductor circuit that performs the method steps explained herein.

The control device may control converters, switches or disconnectors of the BESS to selectively place the selected at least one string into the SoH calibration mode while concurrently maintaining the at least one other string in the operative mode. Controlling the converters may be particularly suitable to control the power flow during the SoH calibration.

A control device for controlling a SoH estimation of a rechargeable battery energy storage system is also provided. The rechargeable battery energy storage system comprises a plurality of parallel strings that are individually controllable. The control device comprises an interface operative to be coupled to the plurality of parallel strings. The control device comprises at least one integrated semiconductor circuit coupled to the interface and operative to select at least one string from the plurality of parallel strings, control the rechargeable battery energy storage system to place the selected at least one string into a SoH calibration mode for a SoH calibration while concurrently maintaining at least one other string of the plurality of parallel strings in operative mode, and control the rechargeable battery energy storage system to cause the selected at least one string to return to operative mode after the SoH calibration has been completed for the selected at least one string.

The control device may be operative to control the plurality of parallel strings such that the at least one other string that is maintained in the operative mode is used for storing energy that is supplied to a grid or at least one power consumer.

The control device may be operative to control the plurality of parallel strings such that the at least one other string in the operative mode is used to compensate for the fact that the selected at least one string is in the SoH calibration mode.

The control device may be operative to control the plurality of parallel strings such that, in response to the selected at least one string being placed into the SoH calibration mode, a current flow into or out of the at least one other string that is maintained in operative mode is increased, so as to ensure that the BESS meets a required load profile. The required load profile may be a load profile that ensures that the BESS provides frequency stabilization, load regulation, and/or voltage support for a grid. The grid may be a national or regional grid or an islanded grid.

The control device may be operative to control the plurality of parallel strings such that the amount of current supplied to the at least one other string in the operative mode is increased in response to the selected at least one string being placed into the SoH calibration mode, when energy is stored in the BESS.

The control device may be operative to control the plurality of parallel strings such that the amount of current supplied by the at least one other string in the operative mode is increased in response to the selected at least one string being placed into the SoH calibration mode, when energy is provided by the BESS to a grid or consumer.

The control device may be operative to control the plurality of parallel strings such that at anytime during the SoH estimation, at least 50% of the total number of strings in the plurality of strings may be maintained in the operative mode.

The control device may be operative to control the plurality of parallel strings such that at any time during the SoH estimation, at least 70% of the total number of strings in the plurality of strings may be maintained in the operative mode.

The control device may be operative to control the plurality of parallel strings such that at anytime during the SoH estimation, at least 80% of the total number of strings in the plurality of strings may be maintained in the operative mode.

The control device may be operative to control the plurality of parallel strings such that at any time during the SoH estimation, at least 90% of the total number of strings in the plurality of strings may be maintained in the operative mode.

The control device may be operative to control the plurality of parallel strings such that at any time during the SoH estimation, only one or two of the parallel strings may be concurrently placed in the SoH calibration mode.

The control device may be operative to control the plurality of parallel strings such that one or several SoH calibration cycles are performed for the selected at least one string while the selected at least one string is in the SoH calibration mode and before the selected at least one string is caused to return to the operative mode.

The control device may be operative to rank and/or match the plurality of parallel strings based on performance characteristics.

The control device may be operative to use performance characteristics that include a degradation indicator for each of the plurality of parallel strings.

The degradation indicator may be based on the SoH estimation results obtained in a preceding SoH estimation procedure, and/or based on current drawn from each of the plurality of parallel strings, e.g., while the plurality of parallel strings are disconnected from a grid.

The control device may be operative such that ranking the plurality of parallel strings comprises establishing a sequence of the parallel strings that is dependent on the performance characteristics.

The control device may be operative such that matching the plurality of parallel strings comprises identifying a plurality of pairs of strings. The identified pairs may be those strings that have performance characteristics that are most similar to each other, based on a metric. The identified pairs may be those strings for which a modulus of the difference in performance characteristics (e.g., the difference of a SoH quantifier or the difference in current drawn while the strings are disconnected from a grid) is less than a threshold or becomes minimized.

The control device may be operative to control the plurality of parallel strings such that it successively performs the steps of selecting the at least one string, placing the selected at least one string into the SoH calibration mode, and causing the selected at least one string to return to the operative mode for at least a sub-set of the plurality of parallel strings. The control device may be operative to control the plurality of parallel strings such that it successively performs the steps of selecting one or several strings, placing the one or several strings into the SoH calibration mode, and causing the one or several strings into to return to operative mode until all of the parallel strings have been placed into the SoH calibration mode and SoH calibration has been performed.

The control device may be operative to determine an order in which strings are selected for SoH calibration.

The control device may be operative such that the order is determined based on the ranking. For illustration, the control device may place the strings successively into the SoH calibration mode (one-by-one or in sets of two or more strings) in an order that is determined by the performance characteristics.

The control device may be operative such that the order is determined based on the matching. For illustration, the control device may be operative such that pairs of strings identified based on the performance characteristics are concurrently placed into the SoH calibration mode.

The control device may be operative to select a first string and a second string that are concurrently placed into the SoH calibration mode, wherein, during at least part of the SoH calibration, the second string acts as an energy sink for energy discharged from the first string.

The control device may be operative to control a power flow through a converter that is interconnected between the selected at least one string and a point of common coupling in accordance with a calibration load profile to place the selected at least one string into the SoH calibration mode.

The control device may be operative to control the power flow through the converter connected to the selected at least one string in accordance with the calibration load profile and independently of a load profile of the BESS towards the grid or consumer connected to the point of common coupling.

The control device may be operative to control power flows through converters interconnected between the at least one other string maintained in the operative mode such that the power flows are dependent on the load profile of the BESS towards the grid or consumer connected to the point of common coupling and, optionally, also the calibration load profile of the selected at least one string that is placed into the SoH calibration mode.

The control device may be operative to cause the selected at least one string to be disconnected from a point of common coupling and cause it to be temporarily connected to a SoH cycle energy source and/or energy sink to place it into the SoH calibration mode.

The SoH cycle energy source and/or energy sink may be disconnected from a point of common coupling of the plurality of parallel strings at least during the SoH calibration.

The SoH cycle energy source may be a dedicated SoH energy source used only for SoH calibration.

The SoH cycle energy source and/or energy sink may be another one of the strings.

The control device may be operative to control charging and/or discharging of cells of the selected at least one string in accordance with a calibration load profile during the SoH calibration.

The calibration load profile may be predetermined or operator-defined.

The control device may be operative such that the calibration load profile used for charging and/or discharging the selected at least one string during SoH calibration is independent of the load of the remaining at least one other string that concurrently remains in the operative mode. For illustration, the control device may be operative such that the calibration load profile used for charging and/or discharging the selected at least one string during SoH calibration may be independent of the rate at which energy is concurrently stored (e.g., from a grid or a local energy source, such as a renewable energy source) in the at least one other string that is operated in the operative mode. The control device may be operative such that the calibration load profile used for charging and/or discharging the selected at least one string during SoH calibration is independent of the rate at which energy is concurrently provided (e.g., to a grid or consumer) by the at least one other string that is operated in the operative mode.

The control device may be operative such that the selected at least one string is charged to a first level that exceeds a first threshold and is discharged to a second level that is less than a second threshold during each successive SoH calibration cycle performed during the SoH calibration.

The first threshold may be 80% or more, 90% or more, 95% or more, or 97% or more.

The second threshold may be 20% or less, 10% or less, 5% or less, or 3% or less.

The control device may be operative such that a SoH calibration cycle performed during the SoH calibration may involve charging and discharging a string over an interval from 20% or less to 80% or more, from 10% or less to 90% or more, from 5% or less to 95% or more, or from 3% or less to 97% or more of its nominal capacity.

The control device may be operative to control the plurality of parallel strings such that all strings of the plurality of parallel strings except for the selected at least one string are maintained in the operative mode.

The control device may be operative to automatically determine a time at which the SoH estimation is to be initiated.

The control device may be operative to determine the time at which the SoH estimation is to be initiated based on historical load profiles of the BESS. The control device may be operative to determine the time at which the SoH estimation is to be initiated based on a priori information for the load profile of the BESS.

The control device may be operative to determine several parameters defined by an equivalent circuit model (ECM) of the selected at least one string or of each cell of the selected at least one string.

The control device may be operative to determine the several parameters independently of the state of charge (SoC) estimates of a battery management system (BMS).

The several parameters determined by the control device may comprise an internal resistance.

The several parameters determined by the control device may comprise several internal resistances.

The several parameters determined by the control device may comprise information on a relative capacity of two capacitances in the ECM.

The relative capacity may include a quotient of the two capacitances.

The control device may be operative to determine the several parameters using an iterative procedure. Each iteration may include a combined state and parameter estimation.

The control device may be operative to use a measured cell open circuit voltage (OCV) as input for the iterative procedure.

The control device may be operative to perform the estimation of the several parameters of the ECM in each iteration based on a Pyomo model.

The control device may be operative to perform the method according to an embodiment.

A rechargeable battery energy storage system comprises a plurality of parallel strings that are individually controllable and a control device according to an embodiment, the control device being coupled to the plurality of parallel strings.

The BESS may operative provide at least one ancillary service to a grid.

The at least one ancillary service may be selected from a group consisting of frequency response, load regulation, and voltage support.

The plurality of parallel strings may form a stationary battery energy storage system, BESS.

The plurality of parallel strings may be installed onboard a vehicle.

Each string of the plurality of parallel strings may comprise a plurality of cells.

The cells may be Li ion cells, without being limited thereto.

The device, method, and system according to embodiments provide various advantages. Full charge and discharge cycles may be carried out on the selected at least one string, while the BESS remains operative to perform its desired function. The disclosed techniques are particularly suitable for BESSs that provide ancillary services, such as frequency stabilization, voltage regulation, etc. For security reasons, such BESSs are often dimensioned for large loads, while actually operating and much smaller loads for the vast majority of their lifetime. This makes it possible to take individual strings out of the operative mode for performing full charge and discharge cycles, while the BESS is still capable of performing its desired ancillary function for the grid.

The device, method, and system according to embodiments also allow the SoH to be determined individually for each string. This allows the SoH to be determined not only for the BESS as a whole, but individually for each string. The SoH of individual strings can be assessed.

BRIEF DESCRIPTION OF THE DRAWINGS

The subject-matter of the invention will be explained in more detail with reference to preferred exemplary embodiments which are illustrated in the attached drawings, in which.

DETAILED DESCRIPTION OF ILLUSTRATIVE EMBODIMENTS

Figure 1:
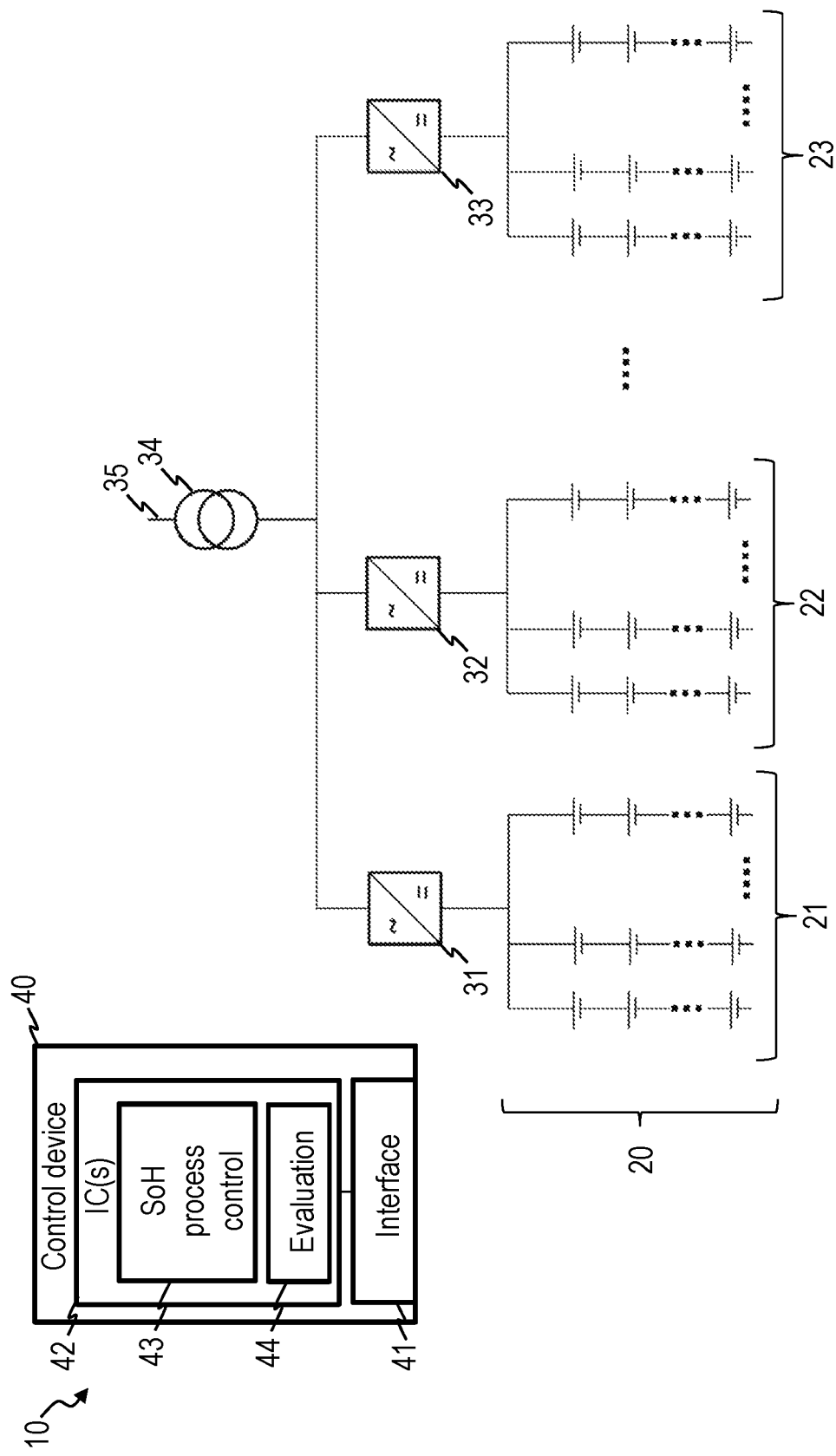
FIG. 1 is a schematic representation of system having a control device according to an embodiment.

Exemplary embodiments of the invention will be described with reference to the drawings in which identical or similar reference signs designate identical or similar elements. While some embodiments will be described in the context of a stationary battery energy storage system (BESS) or a BESS installed onboard a vehicle, the invention is not limited thereto. While embodiments of the invention are applicable to energy storage systems that each are based on Li-ion batteries, the invention is not limited thereto any may be applied to other types of BESS.

The features of embodiments may be combined with each other, unless specifically noted otherwise.

Identical or similar reference numerals are used to designate identical or similar elements in the drawings.

FIG. 1 is a schematic representation of a system 10. The system 10 comprises a rechargeable battery energy storage system (BESS). The rechargeable BESS comprises a plurality 20 of parallel strings 21-23 that are individually controllable. Each of the plurality of parallel strings 21-23 may comprise a plurality of cells. The plurality of parallel strings 21-23 may be coupled to a point of common coupling 35 via converters and/or transformers 31-34.

The strings 21-23 each include at least one series connection of cells, e.g., Li ion cells. Some or all of the strings may include several series connections of cells, which are coupled in parallel to each other, as schematically illustrated in FIG. 1.

The BESS may be coupled to a grid at the point of common coupling 35. The grid may be a national or regional power grid. The grid may be an islanded grid.

The BESS may be operative to provide ancillary services to the grid, such as providing frequency stabilization, load regulation, and/or voltage support. A BESS operative to provide such ancillary services is often dimensioned to accommodate peak needs, but operates at much lower powers or loads that those for which it is designed throughout most of its operation. The techniques describes in detail herein are particularly suitable for such BESSs that must be able to provide certain performance characteristics, e.g., due to contractual obligations or to accommodate worst case scenarios, but that typically are operated at loads that are much smaller than the rated loads for which they are designed.

According to some embodiments, at a time a single string selected from the plurality of parallel strings 21-23 (e.g., string 21) may be put into SoH calibration mode while the BESS is still fully in operation, and all the other remaining strings (e.g., strings 22 and 23) provide the difference to the required load profile of the BESS. One or several SoH calibration cycles may be performed on the string that is selected and placed into the SoH calibration mode. In this process, the selected string may be charged and discharged essentially completely. After SoH calibration has been completed for a string (e.g., string 21), the string can be put back into normal operation, and SoH calibration can be executed on a next string (e.g., any one of the remaining strings 22 and 23).

According to other embodiments, two strings may be put simultaneously in SoH calibration mode and may be operated in reverse directions, i.e., charge one of the two strings that are in SoH calibration mode while the other string that is in SoH calibration mode is discharged. For illustration, if (in particular in a battery having a large number of strings, e.g., five or more strings or ten or more strings) two strings are concurrently placed in SoH calibration mode, the remaining strings may be operated to serve the load required by the BESS without offset.

For string(s) placed into the SoH calibration mode, the power flow through the one or two converters 31-33 connected to the strings 21-23 placed into the SoH calibration mode may be controlled in accordance with a calibration load profile. The calibration load profile may involve essentially complete charging and discharging of the selected string(s) placed in the SoH calibration mode. The converters connected to the other strings that remain in operative mode may be controlled in accordance with the load profile of the complete BESS towards the point of common coupling 35 and, optionally, also dependent on the calibration load profile.

If the BESS is used for applications with load profiles that usually have a load that is much smaller than the rated load, such as frequency regulation, then the techniques disclosed herein can be readily applied throughout most, if not all, of the life operation time of the BESS.

For other applications such as peak shaving, that require the rated load regularly, it is still possible to synchronize the SoH maintenance with the load profile. This can be achieved readily if the load profile is known in advance, but can still be done even if the load profile is not known in advance.

As a result, accurate SoH estimations for each one of plural separate strings 21-23 are possible, enabling more advanced control and monitoring to be realized within the BESS system. This can be achieved without having to put the full BESS out of operation. When one or two of the strings 21-23 are placed into the SoH calibration mode, all other strings may be operated so as to compensate the deficit that would be created by placing the one or two strings into the SoH calibration mode. The remaining strings that remain in the operative mode (i.e., that serve to fulfill the function for which the BESS is installed, such as frequency regulation, etc.) may also provide the energy required for charging the string(s) placed into the SoH calibration mode.

The system 10 comprises a control device 40. The control device 40 may be operative to control the SoH estimation process. The control device 40 may include an interface 41 connected to the plurality of strings. The interface 41 may be operative to control the plurality of strings, e.g., via controlling converters 31-33, switches, or via communicating with a battery management system (BMS).

The control device 40 includes one or several integrated circuits (ICs) 42. The IC(s) 42 may comprise one or several of a processor, a microprocessor, a controller, a microcontroller, an application specific integrated circuit (ASIC), or a combination thereof.

The IC(s) 42 may be operative to execute a control module 43 for controlling the SoH estimation process. The IC(s) 42 may be operative to select at least one string from the plurality of parallel strings 21-23. The selection may be performed such that only one or only two of the strings 21-23 are selected for placing them into a dedicated SoH calibration mode (in which they are not available for assisting the other strings in performing the desired function of the BESS), at any time during the SoH estimation. The IC(s) 42 may successively select all of the strings 21-23 and place them in the SoH calibration mode, with only one or two of the strings 21-23 being selected at any time during the SoH estimation. The selection may be performed in accordance with a rating or matching of strings, as will be explained below. The IC(s) 42 may optionally use historical information on previous SoH estimations or other degradation indicators to determine in which sequence the strings 21-23 are placed into the SoH calibration mode. In other implementations, the IC(s) 42 may select the strings 21-23 for placing them into the SoH calibration mode at pre-determined order or in a random order.

Placing the selected one or more of the strings 21-23 into the SoH calibration mode may be done by controlling the power flow to and from the selected at least one string during the SoH calibration. Exemplary evaluation techniques that may be implemented by the control device 40 will be described below.

The IC(s) 42 may be operative to cause the selected at least one string to be placed into a SoH calibration mode for performing a SoH calibration while concurrently maintaining at least one other string of the plurality of parallel strings, and preferably all strings apart from the selected at least one string, in operative mode. The strings that are maintained in operative mode remain coupled to the point of common coupling 35 and provide energy storage towards the grid or consumer connected to the point of common coupling 35. The strings that are maintained in operative mode are operated so as to compensate the fact that the selected at least one string is not available for assisting in performance on the normal BESS operation while it is being placed in the SoH calibration mode. The IC(s) 42 may be operative to output control signals or control commands to the converters 31-33 connected to the strings 21-23, to switches and/or to a BMS to place the selected at least one string into the SoH calibration mode. The IC(s) 42 may be operative to cause the selected at least one string to be disconnected from the point of common coupling 35 while SoH calibration is performed.

Maintaining the at least one other string in operative mode may be implemented by controlling power flow to and from each string of the at least one other string maintained in operative mode such that the BESS meets the required load profile towards the point of common coupling 35. E.g., converters 31-33 connected to the at least one other string maintained in operative mode may be controlled based on the load profile of the BESS towards the point of common coupling. Optionally, when the at least one other string that is maintained in operative mode also acts SoH cycle source, power flow through the converters 31-33 connected to the at least one other string maintained in operative mode may additionally be dependent on the calibration load profile applied to the selected at least one string that is taken out of the operative mode and that is placed into the SoH calibration mode.

The IC(s) 42 may cause the selected at least one string to be charged and discharged once or several times in one or several SoH calibration cycles. A calibration load profile may be applied in the SoH calibration cycles, which may be predefined or operator-defined, e.g., via a user interface of the control device 40. The SoH calibration cycle(s) may each involve essentially fully charging the selected at least one string (e.g., to at least 80%, 90%, 95% or 97% of its rated maximum state of charge) and essentially fully charging the selected at least one string (e.g., to less than 20%, 10%, 5% or 3% of its rated maximum state of charge).

The IC(s) 42 may control the selected at least one string to be charged and discharged once or several times in accordance with the calibration load profile by controlling the converter coupling the selected at least one string to the point of common coupling 35.

During the SoH calibration of a selected string, e.g., of string 21, one or several of the other strings 22 and 23 may act as SoH cycle source that charges this string while it is being placed in the SoH calibration mode. The IC(s) 42 may control all converters 31-33 while a selected string (e.g., string 21) is placed into the calibration mode such that the current flow through the converter 31 connected to the selected string 21 placed into the SoH calibration mode is in accordance with the calibration load profile and is independent of the overall current flow of the BESS towards the grid or consumer at the point of common coupling 35, and such that the current flow through all converters 32, 33 connected to the other strings 22, 23 that remain in the operative mode is so as to provide the desired overall current flow of the BESS towards the grid or consumer, and optionally can provide the current required for the SoH cycling through the converter 31.

If dedicated SoH cycle sources and/or sinks separate from the plurality of individually controllable strings are used, it is not required for the other strings 22, 23 that are maintained in operative mode to provide the current required for the SoH cycling through the converter 31. Similarly, if pairs of strings are selected such that two strings are taken out of the operative mode and one of the selected strings acts as SoH source for the other and vice versa, it is not required for all of the remaining strings that remain in operative mode to supply the power for SoH cycling.

The IC(s) 42 may cause the selected at least one string to return to operative mode after the SoH calibration has been completed for the selected at least one string. This may comprise outputting control signals or control commands to a converter or a switch connected to the selected at least one strings and/or to a BMS.

The IC(s) 42 may also execute an evaluation module 44 to perform the SoH estimation for the selected at least one string while it is being placed in the SoH calibration mode. The IC(s) 42 may be operative to determine several parameters defined by an equivalent circuit model (ECM) of the selected at least one string or of each cell of the selected at least one string. The several parameters may comprise several internal resistances and information on a relative capacity of two capacitances in the ECM, as will be explained in more detail below.

The IC(s) 42 may be operative to successively control place all parallel connected strings 21-23 into the SoH calibration mode and to determine the several parameters defined by the ECM, while all other strings not placed in the SoH calibration mode may contribute to the normal operation of the BESS towards the grid or a local consumer connected to the point of common coupling 35. The other strings not placed in the SoH calibration mode may optionally also act as SoH calibration cycle source that supplies energy to the selected at least one string placed into the SoH calibration mode. The SoH estimation may be implemented in such a way that, at any time during the SoH estimation, a maximum of one or two strings is in the SoH calibration mode.

Figure 2:
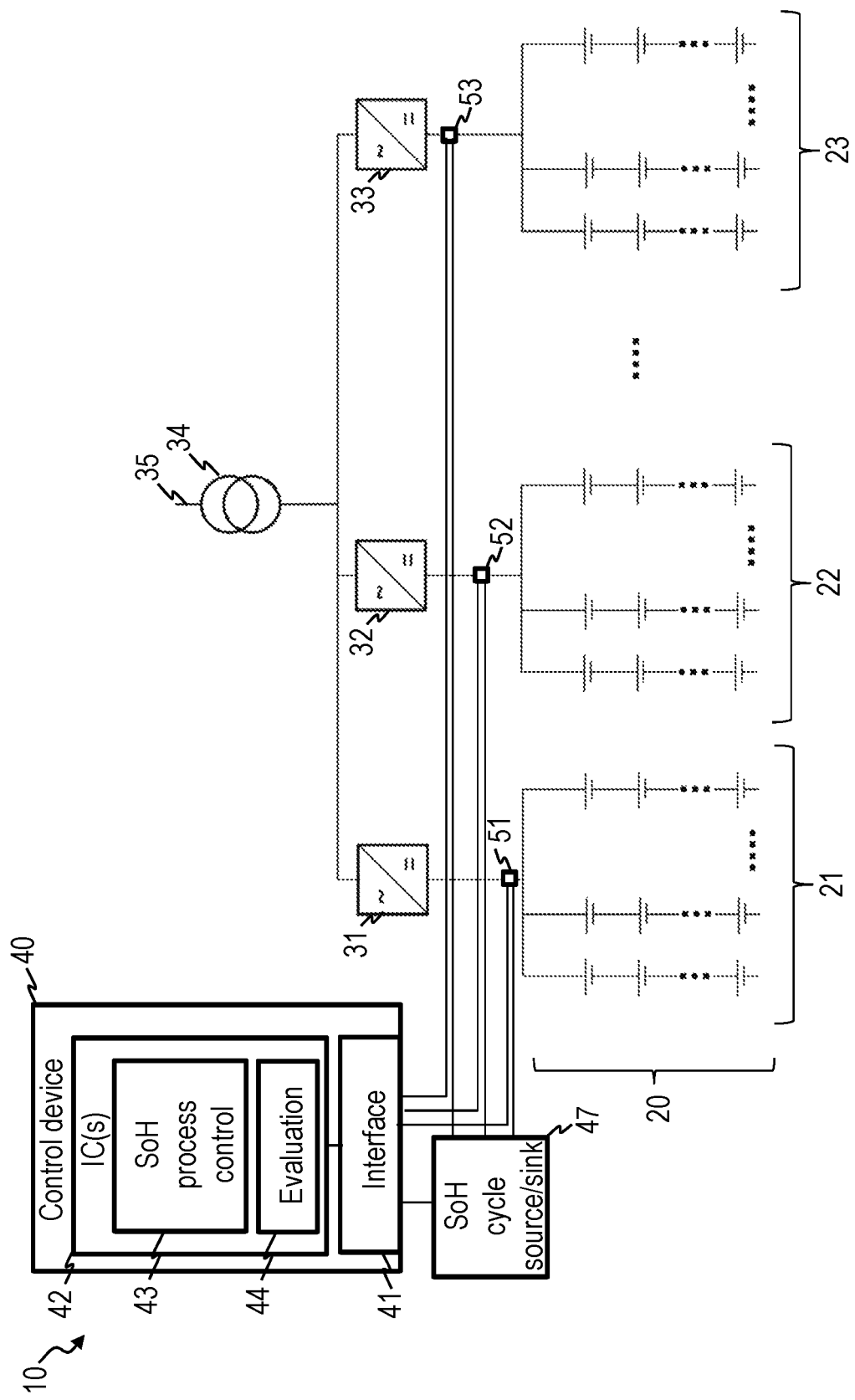
FIG. 2 is a schematic representation of system having a control device according to an embodiment.

FIG. 2 schematically a system 10 according to an embodiment. The system 10 may have a SoH cycle source and/or sink for providing and/or receiving power during performance of a SoH calibration when a selected at least one string 21-23 is placed into the SoH calibration mode. Switches 51-53 may be provided that are controllable by the control device 40 for performing the SoH estimation. The control device 40 may control a switch (such as switch 51) to disconnect the selected at least one string (such as string 21) from the point of common coupling 35 and to connect the selected at least one string to the SoH cycle source/sink 47. The control device 40 may control a switch (such as switch 51) to re-connect the selected at least one string (such as string 21) to the point of common coupling 35 and to disconnect the selected at least one string from the SoH cycle source/sink 47, to cause the selected at least one string to return to the operative mode in which it contributes to the operation provided by the BESS towards the grid or consumer connected to the point of common coupling 35.

The control device 40 may trigger additional actions, that affect both the selected at least one string that is placed into the calibration mode and the other strings that remain in the operative mode, when the selected at least one string is placed into the SoH calibration mode and when it is made to return to operative mode.

Placing the selected at least one string into the SoH calibration mode may trigger the control device 40 to concurrently cause the other strings that remain in operative mode to compensate for the fact that the selected at least one string is not available for storing and/or providing charge towards the grid or consumer connected to the point of common coupling 35 while in the SoH calibration mode. The control device 40 may trigger the current provided to or from the other strings that remain in operative mode to be increased accordingly to compensate for the fact that the selected at least one string is temporarily taken out of normal operation. This may be implemented by, e.g., a corresponding command output by the control device 40 to the converters interconnected between the at least one other string that remains in operative mode and the point of common coupling. Alternatively or additionally, the control device 40 may output the control commands to a BMS or another entity that controls the charging and discharging in the BESS.

Causing the selected at least one string to return to the operative mode may trigger the control device 40 to concurrently change the operation of the other strings that have previously remained in operative mode. For illustration, it is no longer required that those other strings compensate for the fact that a string was previously unavailable to contribute to the normal operation of the BESS towards the grid or consumer connected to the point of common coupling 35. The control device 40 may trigger the current provided to or from the other strings that have previously remained in operative mode to be reduced accordingly to take into account the that selected at least one string is now returned to the operative mode. This may be implemented by, e.g., a corresponding command output by the control device 40 to the converters interconnected between the at least one other string that remains in operative mode and the point of common coupling. Alternatively or additionally, the control device 40 may output the control commands to a BMS or another entity that controls the charging and discharging in the BESS.

Figure 3:
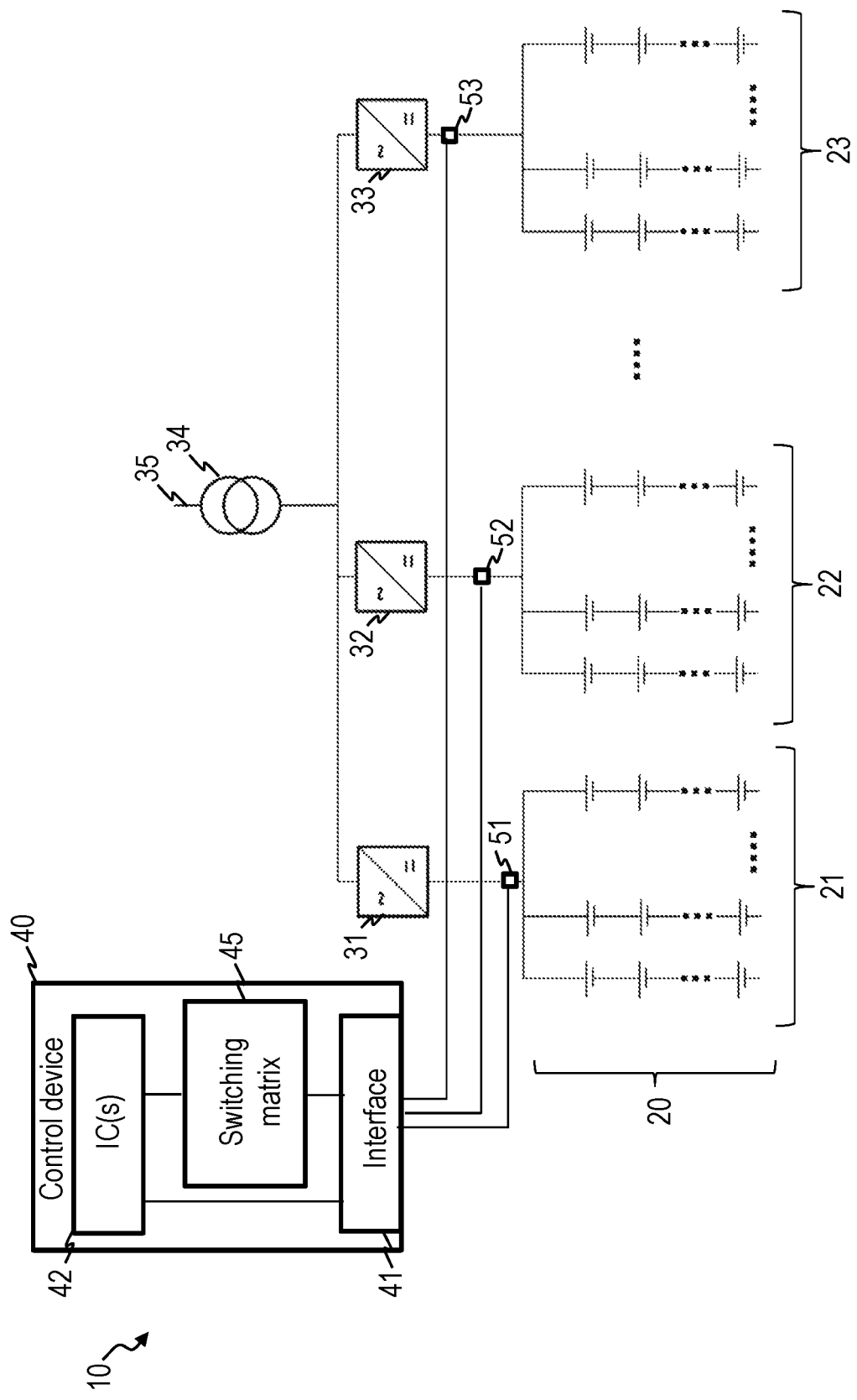
FIG. 3 is a schematic representation of system having a control device according to an embodiment.

FIG. 3 is a diagram of a system 10 according to an embodiment. Two strings, such as first and second strings 21, 22 may be concurrently selected for performing SoH calibration. All other strings may remain in operative mode. The control device 40 may cause the selected first and second strings 21, 22 to operate such that one acts as SoH cycle source for the other that acts as SoH cycle sink, and vice versa. For illustration, during SoH calibration, a first string 21 may first be charged with energy from the second string 22, and the first string 21 may subsequently discharge into the second string 22. This may be done while both the first string and the second string are disconnected from the point of common coupling 35.

The system 10 may have a switching matrix 45 that allows arbitrary combinations of pairs of strings to be connected to each other. The switching matrix 45 may be integrated into the control device 40 or may be provided separately therefrom and may be controlled by the IC(s) of the control device 40.

The IC(s) 42 may be operative to select plural pairs of strings, with the different pairs being successively placed into the SoH calibration mode in such a way that two strings are concurrently in the SoH calibration mode. The decision on which strings are combined to form a pair may be made automatically by the IC(s) 42, e.g., using a suitable degradation indicator or other performance characteristics, as will be explained below.

For any one of the systems of FIGS. 1 to 3, the SoH estimation may be performed as part of a condition monitoring system where, if the State of Health or the rate of change of the State of Health for a particular string exceeds a given threshold, a notification (e.g., an alarm or other information) is signaled to an end user and/or a maintenance action is scheduled. The control device 40 may have an interface for outputting a notification (e.g., an alarm or other information) to an end user and/or for outputting information on a scheduled maintenance action.

The methods and control devices according to the invention allow the current SoH of each string (e.g., each rack) to be calculated accurately. Rather than providing a bulk measure of the state of health of the entire BESS, the methods and devices according to the invention allow the health of each individual string (e.g., rack) to be ascertained. This ensures that the SoH estimation can be performed more reliably and with greater sensitivity. This mitigates the risk of false or missed alarms and the associated costs. Additionally, maintenance can be performed more efficiently as maintenance personal will know exactly which racks or cells need replacement or maintenance. When the BESS consists of parallel strings, which act as batteries by their own in the sense that they have, e.g., individual converters, the principles disclosed herein can be applied to each one of the parallel strings in a successive manner. Non-uniform operation of the strings can be realized, e.g., by means of controlling power flow in the individual converters and/or by disconnecting strings from a point of common coupling.

Figure 4:
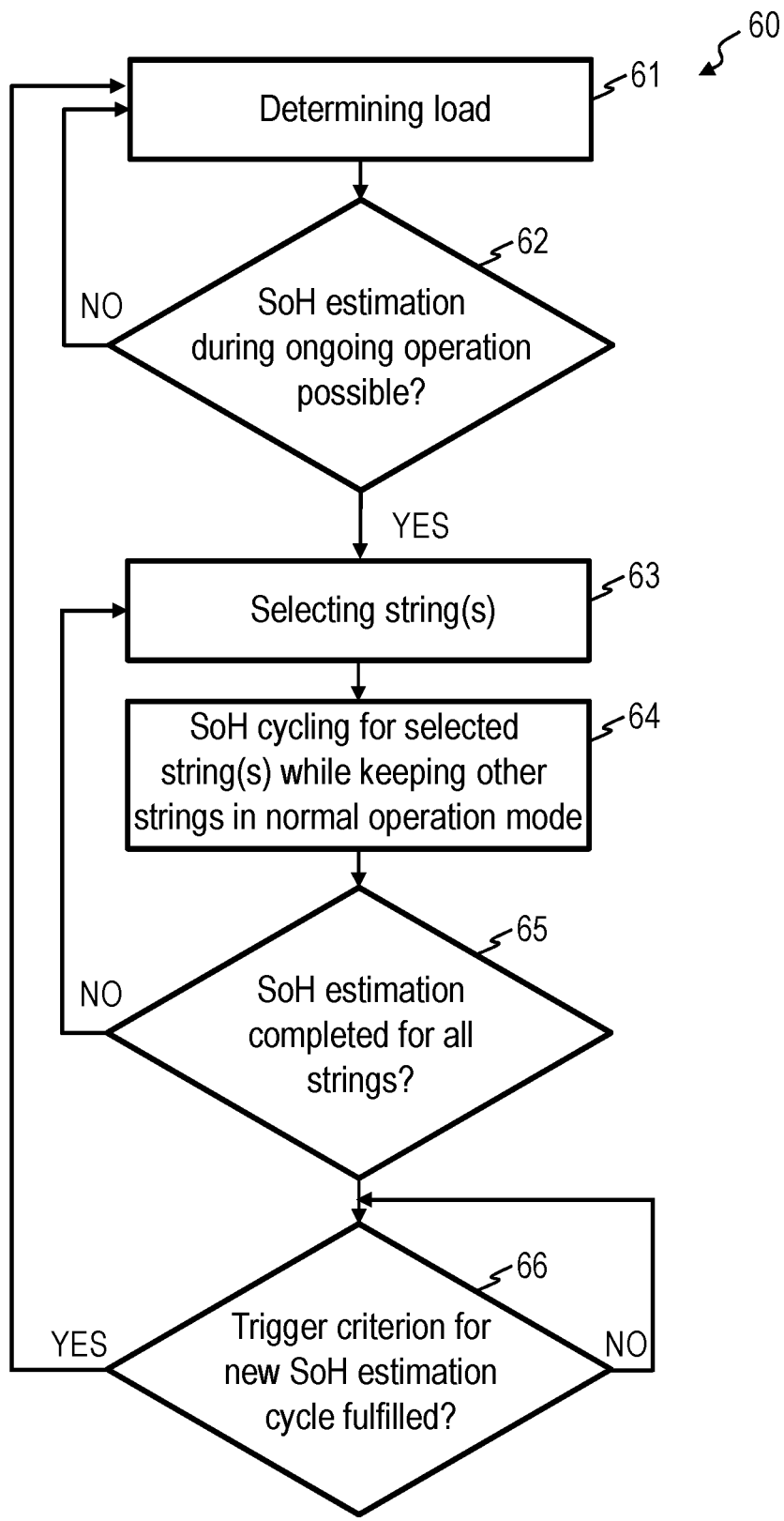
FIG. 4 is a flow chart of a method according to an embodiment.

FIG. 4 is a flow chart of a method 60 according to an embodiment. The method 60 may be performed by the control device 40 or under the control of the control device 40.

At step 61, a load of the BESS toward the point of common coupling 35 is determined. This may comprise receiving sensor readings, using historical load profile information of the BESS and/or using a priori knowledge of BESS load.

At step 62, it is determined whether the SoH estimation can be performed at this time during ongoing operation of the BESS, i.e., while allowing the BESS to provide the performance. The determination may be performed using, e.g., the current load determined from sensor readings alone in combination with historical load profile information of the BESS and/or using a priori knowledge of BESS load. If the SoH estimation cannot be performed at this time, e.g., because the current BESS load is temporarily so high that it would not allow a string to be selected for temporarily taking it out of the operative mode and for performing SoH calibration without violating safety margin requirements, the method may return to step 61. Otherwise, the method may proceed to step 63.

At step 63, at least one string may be selected. The selection of the string may be done in accordance with a pre-defined order. The order in which strings are selected may be dependent on performance characteristics or other knowledge on the BESS (e.g., position of the strings within a battery housing, which may affect deterioration). The string selection may be dependent on performance characteristics of all strings, e.g., a degradation indicator. The performance characteristics may be based on the preceding SoH estimation or other information that may be provided, e.g., by the BMS.

At step 64, SoH calibration is performed while the selected string is in a SoH calibration mode that is different from the operative mode and in which the selected string does not contribute to the net power flow from the BESS to the grid or consumer connected to the point of common coupling 35.

A cell Open Circuit Voltage (OCV) may be monitored in dependence on a State of Charge (SoC) during the SoH calibration and may be used to determine the SoH. Exemplary techniques for determining the SoH will be described below. Estimating the SoH may comprise computing one or several internal resistances of an ECM and/or calculating a ratio of capacitances of the ECM.

While the selected at least one string is in the SoH calibration mode, one or several SoH cycles may be performed. In each of the cycles, the string may be charged and discharged essentially completely. Step 63 may comprise charging and discharging the string over an interval from 20% or less to 80% or more, from 10% or less to 90% or more, from 5% or less to 95% or more, or from 3% or less to 97% or more of its nominal capacity At step 65, it is determined whether the SoH estimation has been completed for all strings of the BESS. If only part of the strings have been placed into the SoH calibration mode in this round of SoH estimation, the method may return to step 63 where one of the remaining strings is selected.

When the SoH estimation has been completed for all strings of the BESS, the results may be output or may be used otherwise, e.g., for outputting information that is dependent on the SoH for all strings. The output information may include an alarm, another notification, and/or information on a scheduled or otherwise recommended maintenance action.

Figure 5:
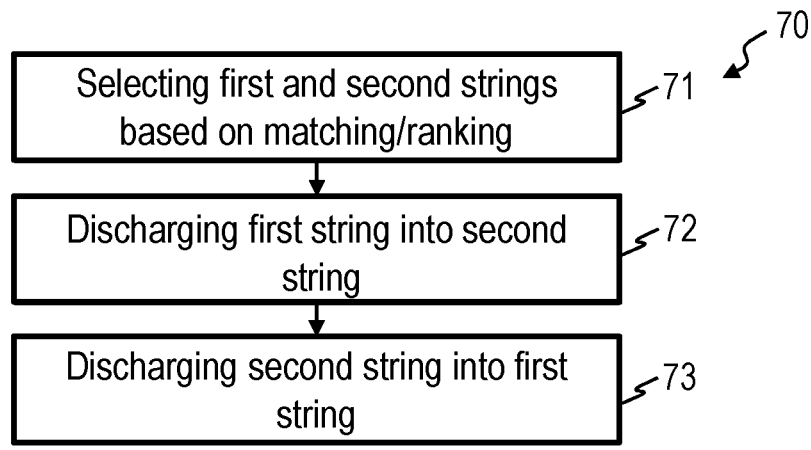
FIG. 5 is a flow chart of a method according to an embodiment.

FIG. 5 is a flow chart of a method 70 according to an embodiment. The method 70 may be performed by the control device 40 or under the control of the control device 40. The method 70 may be performed to implement steps 63 and 64 of the method 60 of FIG. 4.

At step 71, a first string and a second string of the plurality of parallel strings are selected. The first and second strings may be selected based on a matching or ranking of strings. The matching or ranking may be dependent on performance characteristics or other knowledge on the BESS (e.g., position of the strings within a battery housing, which may affect deterioration). The matching or ranking may be dependent on performance characteristics of all strings, e.g., a degradation indicator. The performance characteristics may be based on the preceding SoH estimation or other information that may be provided, e.g., by the BMS.

At step 72, while the first and second strings are placed into the SoH calibration mode, the first string is discharged to the second string. The cell OCV of the first and second strings may be monitored in this process.

At step 73, while the first and second strings are placed into the SoH calibration mode, the second string is discharged to the first string. The cell OCV of the first and second strings may be monitored in this process.

The cell OCV of the first and second strings may subsequently be used to estimate the SoH. Estimating the SoH may comprise computing one or several internal resistances of an ECM and/or calculating a ratio of capacitances of the ECM.

Figure 6:
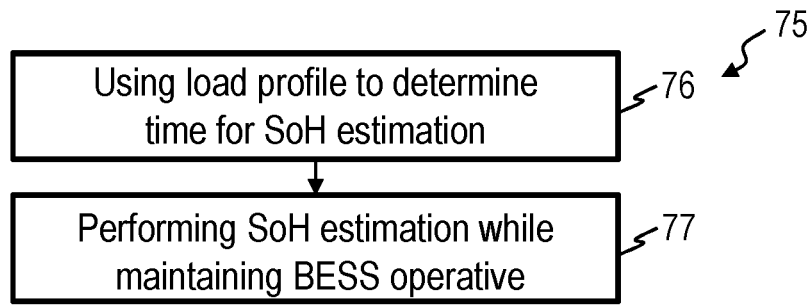
FIG. 6 is a flow chart of a method according to an embodiment.

FIG. 6 is a flow chart of a method 75 according to an embodiment. The method 75 may be performed by the control device 40 or under the control of the control device 40.

At step 76, a load profile of the BESS may be used to determine the time at which the SoH estimation may be performed. The load profile may be based on historical load profiles in the past and/or a priori knowledge based on predicted future loads. For illustration, for various ancillary services such as frequency stabilization, load regulation, voltage support, it is possible to identify in advance time periods that are sufficiently long to complete the SoH estimation by successively placing all strings into the SoH calibration mode, while ensuring that the remaining strings are able to meet the requirements that the BESS has to fulfill towards the grid or local consumer(s), preferably with a safety margin.

Historical load profiles and/or predictions on future load profiles may be used. For isolated systems that are not connected to a national or regional grid and/or for systems that have distributed energy resources (DERs) (such as solar power cells, wind energy generators, or other renewable energy sources), information on weather forecasts may be taken into account to determine the time at which the SoH calibration may be performed.

At step 77, the SoH estimation may be performed by successively placing the strings into the SoH calibration mode (e.g., one-by-one or in pairs), while the remaining strings accommodate the load profile of the BESS towards the point of common coupling. Step 77 may be implemented using steps 63-66 of the method 60 of FIG. 4.

Figure 7:
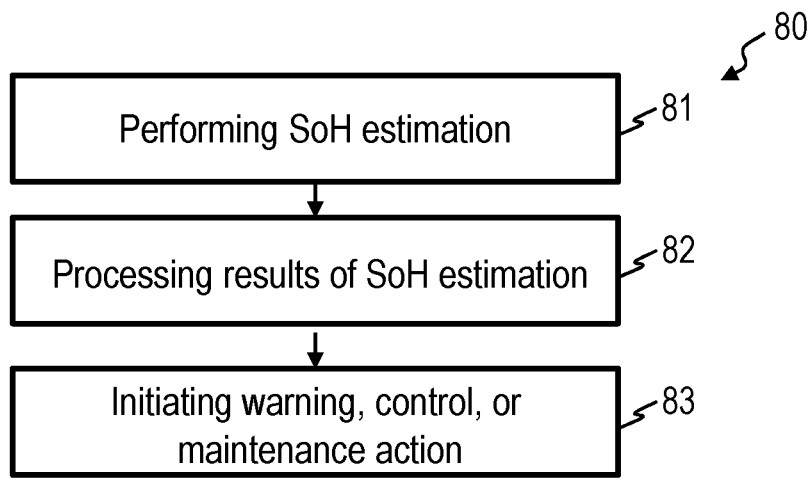
FIG. 7 is a flow chart of a method according to an embodiment.

FIG. 7 is a flow chart of a method 80 according to an embodiment. The method 80 may be performed by the control device 40 or under the control of the control device 40.

At step 81, an SoH estimation is performed. This may be done by successively placing the strings into the SoH calibration mode (e.g., one-by-one or in pairs), while the remaining strings accommodate the load profile of the BESS towards the point of common coupling. Step 81 may be implemented using steps 61-65 of the method 60 of FIG. 4. The SoH estimation may include determining one or several internal resistances of an ECM and/or calculating a ratio of capacitances of the ECM of each string or of cells of each string of the plurality of independently controllable parallel strings.

At step 82, the results of the SoH estimation may be processed. Processing the results of the SoH estimation may include determining, for each one of the plurality of independently controllable parallel strings, whether the SoH of the respective strings requires information to be output the user, a dedicated control action to be performed and/or a maintenance action to be scheduled. The control device 40 or a separate computer may process the results of the SoH estimation by comparing them against a database of historical BESS information (that may include information on previously observed operation conditions for BESSs of the same construction) or to one or several thresholds, which may be provided by the manufacturer of the BESS and which may indicate whether the state of any one of the strings is critical, requires maintenance, or requires other dedicated action.

The processing of the SoH may comprise determining a rate of change of parameter(s) indicative of the SoH (such as internal resistances and/or a ratio of capacitances in the ECM). The rate of change may be used in addition to or alternatively to the absolute values of the parameter(s) indicative of the SoH. For illustration, the absolute values in combination with the rate of change of the parameter(s) (such as internal resistances and/or a ratio of capacitances in the ECM) may be used to predict whether strings move towards a critical condition or a condition that requires a specific action (such as a warning, control or maintenance action), and which strings move towards such a critical condition.

At step 83, a warning, control or maintenance action may be initiated. The warning, control or maintenance action may selectively indicate which string(s) of the plurality of independently controllable parallel strings is in a condition which requires a warning to be output, a dedicated control action to be performed, or maintenance to be performed by a human operator.

The SoH estimation may be used as part of a condition monitoring system where, if the SoH (or the rate of change of the SoH) for a particular string exceeds a given threshold, an alarm may be signaled to an end user and/or or a maintenance action may be scheduled.

Some embodiments of the invention use a ranking of the strings, which determines which rack or battery string enters the SOH calibration mode first, and/or in which order the strings enter the SoH calibration mode. Each separate string of the battery may be prone to different environmental conditions due to, e.g., placement in the BESS (e.g., location relative to HVAC/outer walls or doors of the BESS container). This may result in different degradation rates of the strings.

Figure 8:
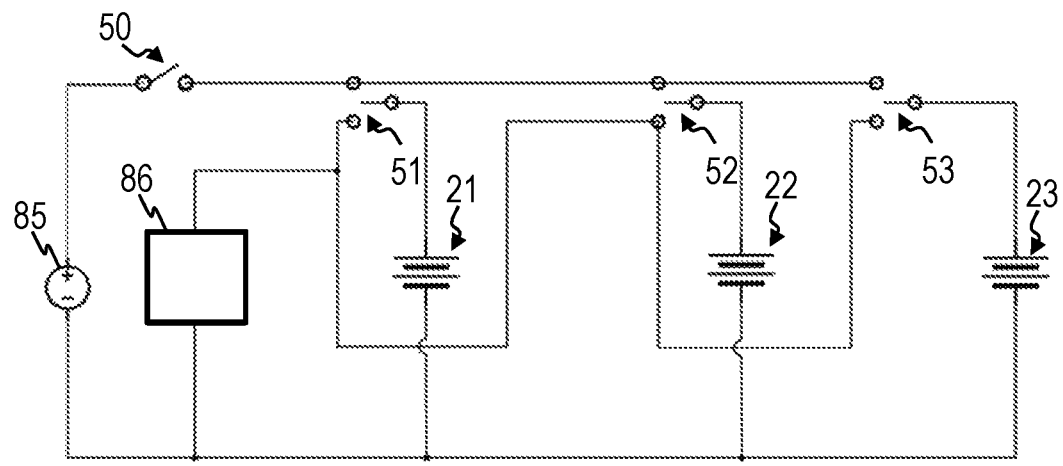
FIGS. 8, 9, 10, and 11 are schematic representations of a system for explaining operation of the device and method according to embodiments.

FIG. 8 presents the circuit of a BESS with three strings 21-23 connected in parallel in its initial state. The outer circuit which contains a DC source 85 (symbolizing supply from the grid) is the power circuit, whereas an inner circuit is dedicated to the SoH calibration cycle and may include a SoH cycle source/sink 86.

Figure 9:
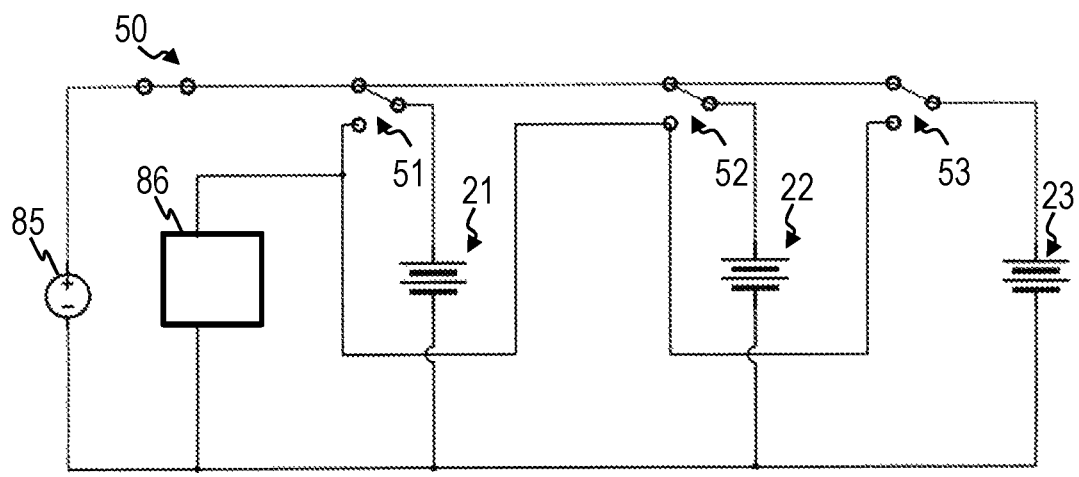

In order to determine a ranking of the strings, the BESS may be connected to the grid 85 through a main switch 50, as shown in FIG. 9, until it is fully charged. Switches 51-53 are controlled so as to connect all of the strings 21-23 to the grid 85 and disconnect them from the SoH cycle source/sink 86.

FIG. 9 shows a configuration in which the BESS is then disconnected from the grid by opening the main switch 50. The current flow across the battery circuit may continue when there is a different degradation of the different strings 21-23 (e.g., a different self-discharge resistance). The most degraded batteries (e.g., strings 21 and 23) draw current from the rest of the strings (e.g., string 22) to preserve voltage balance in the terminals of the BESS. In this way string 22 performs part of the discharge cycle. In other words, the degraded string(s) or cell(s) 21, 23 infect the rest of the battery cells.

The strings 21-23 may be ranked based on the amount of current that they draw when main switch 50 is in the off state in which the BESS is disconnected from the grid 85. The bigger the amount of current drawn by the cell during this period, the sooner it should enter the SoH calibration cycle.

Figure 10:
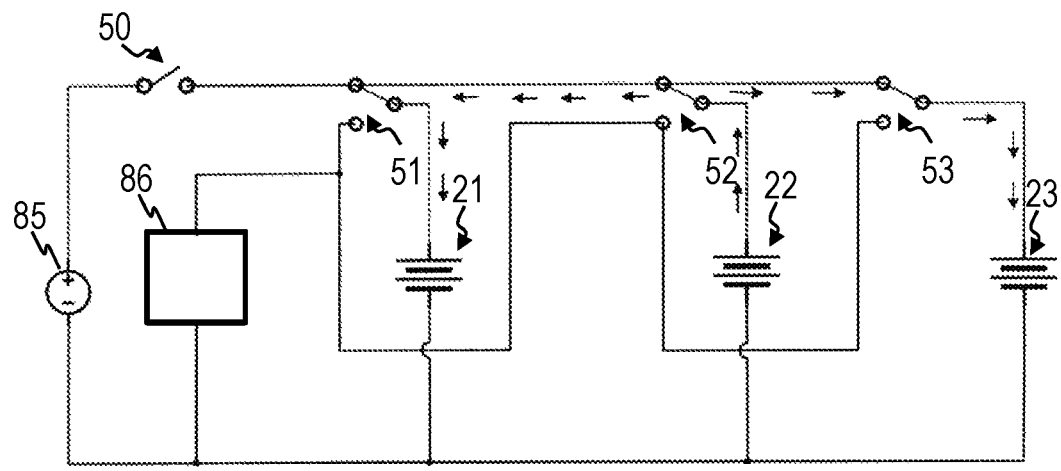
Figure 11:
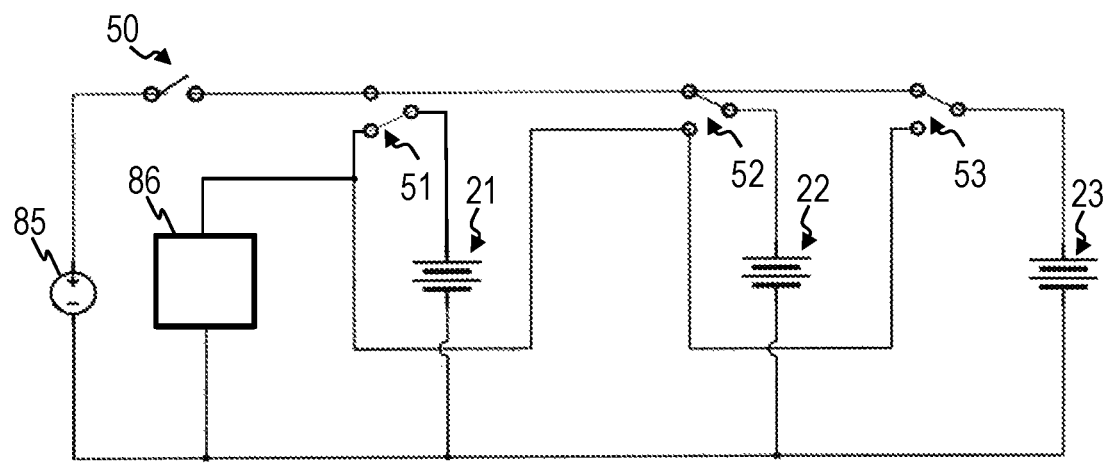

FIG. 10 shows the electrical circuit when string 21 is placed in the SoH calibration mode while the rest of the strings 22, 23 are normally operating.

By using such a degradation based ranking of strings 21-23, the most degraded string (e.g., string 21) will be isolated soon in the SoH estimation. Moreover, its SoH after the calibration cycle may be improved when the cells of the string are not subject to a memory effect, as is the case for, e.g., Li ion cells.

The implementation of the SoH estimation may be done in various ways, respectively for each one of the strings successively placed in the SoH calibration mode. While the implementation of the SoH implementation is not germane, the SoH estimation may generally determine parameters of an ECM of each string or each cell, using the OCV as input. Reference will be made to a "cell" below. It will be appreciated that the cell may be a virtual cell formed by a string or rack, for example.

The SoH estimation may be performed using mathematical programming, in particular non-linear programming. The SoH estimation may be based on a Python Optimization Modeling Objects (Pyomo) model and an optimization routine. The SoH estimation may co-estimate all relevant parameters of the ECM of the battery cell(s) in questions and the actual capacity of the cell(s).

Figure 12:
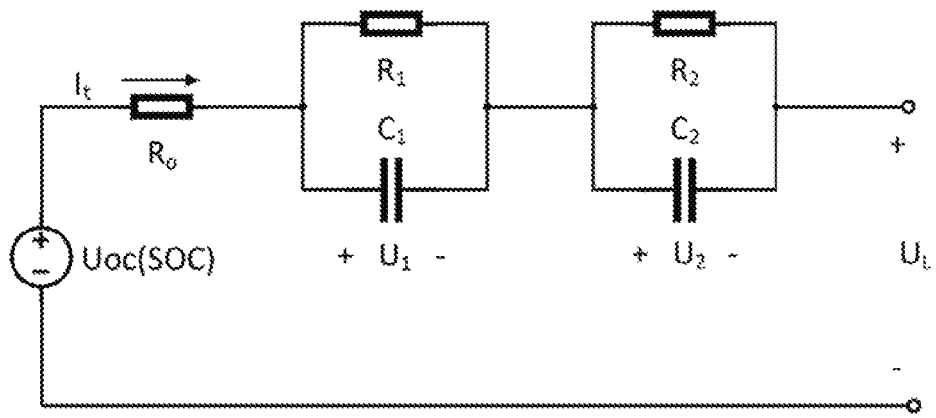
FIG. 12 is a circuit diagram of an equivalent circuit model (ECM) of a string or cell that may be used in embodiments.

FIG. 12 is an exemplary ECM for modeling a cell or string. The state is defined by the SoC and the two (double layer) capacitor voltages $U_1$ and $U_2$. The parameters of the ECM are the internal resistances $R_1$, $R_1$, and $R_2$. These internal resistances may be computed as fixed fractions of a total internal resistance $R_{ch}$ for charge and $R_{disch}$ for discharge. A quotient of the two capacitances $C_1$ and $C_2$ may be another parameter $Q_{rel}$.

Figure 13:
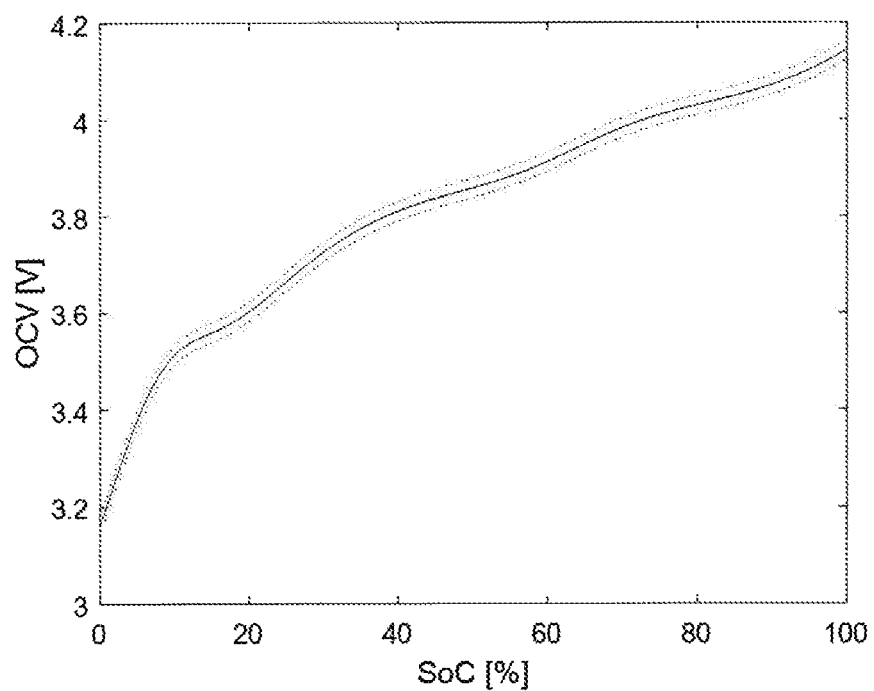
FIG. 13 illustrates a cell open circuit voltage and the hysteresis as a function of state of charge.

The OCV curve (i.e., OCV over SoC) may be used as input of the procedure. FIG. 13 shows an exemplary OCV as a function of SoC. A hysteresis is indicated by broken lines. The hysteresis for charge and discharge may be included into the SoH estimation.

In order to analyze the individual strings or virtual cells, an ECM as described above may be estimated for each virtual cell (which may represent a rack or string). This can be done via a combined state and parameter estimation. The relevant states are SoC, capacitor voltages, and energy throughput. An OCV offset is caused by the hysteresis effect. The relevant parameters are internal resistances and relative capacity. The estimation may be driven by the following two effects:

Overvoltage: When the sign or magnitude of the current changes, static and dynamic overvoltages can be observed. They are used to infer the internal resistances.

Voltage difference: Taking out the overvoltages, the relation of charge throughput and voltage difference leads to an estimate of the cell capacity. A higher voltage difference for the same integral of charge or discharge current indicates a lower capacity.

The SoH estimation may be based on individual cell voltages (with the cell being a virtual cell that may represent, e.g., a rack or string) and rack currents in a given time window. The SoH estimation may be performed without using the BMS SoC estimates are not used.

The estimation may follow a procedure of several model-based estimation steps. An exemplary implementation will be explained with reference to FIG. 14.

Figure 14:
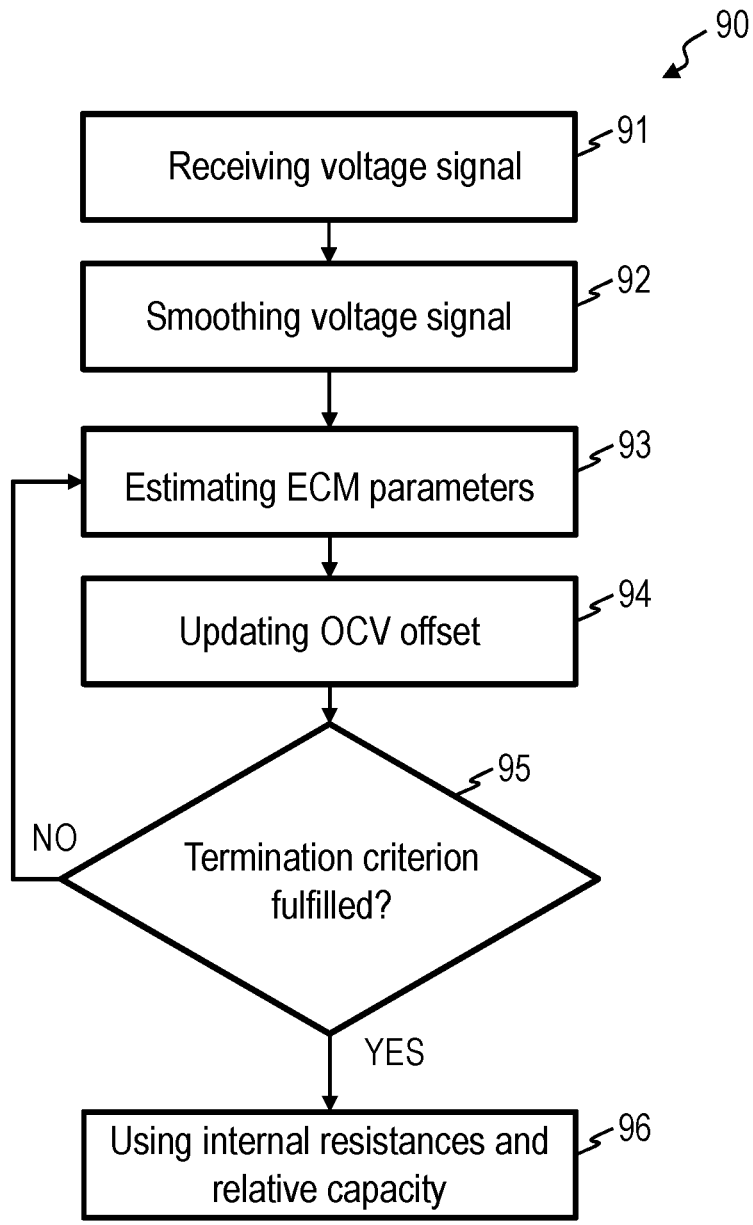
FIG. 14 is a flow chart of a method according to an embodiment.

FIG. 14 is a flow chart of a method 90 that may be used for estimating the SoH parameters. The method 90 may be automatically performed by the IC(s) 42 of the control device 40 or by a separate computing device.

At step 91, the OCV signal is received. The OCV signal may be received separately for each string or rack (which may respectively modeled by a virtual cell) while SoH cycling is performed for the respective string.

At step 92, the OCV signal can be smoothed. This can be done by a Pyomo model.

At steps 93-95, the parameters and state of the ECM are estimated in an iterative routing. At step 93, the ECM parameters and optionally state are estimated. At step 94 an OCV offset due to the hysteresis in the model may be updated.

A single estimation may respectively be performed by a Pyomo model. The model may be defined such that not the current is modeled, but its integral (i.e., the charge throughput so far). This facilitates better correction of measurement errors. The model may be defined such that the resistance is switched between charging and discharging resistance depending on the sign of the current. Overvoltage may be determined from current I, the internal resistance $R_0$ and the two (double layer) capacitor voltages $U_1$ and $U_2$ as $-I R_0 + U_1 + U_2$. The voltage may be determined from the OCV and the OCV offset as sum of OCV and OCV offset. The OCV may be encoded as a linear combination of tanh terms, i.e., an artificial neural network (e.g., a 1-layer artificial neural network).

The estimation of the ECM parameters at step 93 may respectively be based on the minimization of an objective function. The objective function may combine some or preferably all of the following objectives:
a low voltage error,
a low delta current error,
a low current error.

These objectives may be combined as a linear combination with different weighting factors. The SoC and the capacitor voltage evolution may be determined from a constraint list imposed by the ECM.

After solving the ECM so as to obtain the ECM parameters and the ECM state, the OCV offset may be updated (e.g., by imposing a hard limit and cutting the computed overvoltage off at the hard limit), and steps 93-95 may be iterated. A termination criterion may be checked at step 95. The termination criterion may involve a convergence criterion.

At step 96, the ECM parameters may be used. Using the ECM parameters may include determining whether an alarm, control, or maintenance action is required for the respective string, based on the ECM parameters.

Devices and methods according to embodiments can be applied to any BESS with two or more strings that can be independently controlled. Devices and methods according to embodiments can be applied to, e.g., BESSs having powers of 1 MW or more, e.g., 2 MW or more, e.g., 5 MW or more, without being limited thereto.

The BESS may be a stationary BESS, which may be grid connected or islanded. Multiple strings (lineups) of the BESS can be controlled independently. If this condition is satisfied, the devices and methods according to embodiments can also be used for BESS for mobile applications (e.g., BESS installed in electric buses, trucks, cars, ships etc.).

While the invention has been described in detail in the drawings and foregoing description, such description is to be considered illustrative or exemplary and not restrictive. Variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. The mere fact that certain elements or steps are recited in distinct claims does not indicate that a combination of these elements or steps cannot be used to advantage, specifically, in addition to the actual claim dependency, any further meaningful claim combination shall be considered disclosed.

What is claimed is:

1. A method of performing a State of Health (SoH) estimation for a rechargeable battery energy storage system during operation of the rechargeable battery energy storage system, wherein the rechargeable battery energy storage system comprises a plurality of parallel strings that are individually controllable, the method comprising:
   selecting at least one string from the plurality of parallel strings,
   placing the selected at least one string into a SoH calibration mode for performing a SoH calibration while concurrently maintaining at least one other string of the plurality of parallel strings in operative mode, and
   causing the selected at least one string to return to operative mode after the SoH calibration has been completed for the selected at least one string.

2. The method of claim 1, wherein strings are successively placed into the SoH calibration mode in an order determined by ranking and/or matching the plurality of parallel strings based on performance characteristics that include a degradation indicator for each of the plurality of parallel strings.

3. The method of claim 1, wherein maintaining the at least one other string in the operative mode comprises using the at least one other string for storing energy that is supplied to a grid or at least one power consumer.

4. The method of claim 1, wherein, at anytime during the SoH estimation, at least 50% of the total number of strings in the plurality of strings are maintained in the operative mode.

5. The method of claim 1, further comprising performing one or several SoH calibration cycles for the selected at least one string while the selected at least one string is in the SoH calibration mode and before the selected at least one string is caused to return to the operative mode.

6. The method of claim 1, further comprising ranking and/or matching the plurality of parallel strings based on performance characteristics.

7. The method of claim 6, wherein the performance characteristics includes a degradation indicator for each of the plurality of parallel strings.

8. The method of claim 7, wherein the degradation indicator is based on SoH estimation results obtained in a preceding SoH estimation procedure and/or based on current drawn from each of the plurality of parallel strings while the plurality of parallel strings is disconnected from a grid.

9. The method of claim 1, where the steps of selecting the at least one string, placing the selected at least one string into the SoH calibration mode, and causing the selected at least one string to return to the operative mode are performed successively for at least a sub-set of the plurality of parallel strings in the order that is determined based on the ranking and/or matching.

10. The method of claim 1, where the steps of selecting the at least one string, placing the selected at least one string into the SoH calibration mode, and causing the selected at least one string to return to the operative mode are performed successively for all of the plurality of parallel strings in the order that is determined based on the ranking and/or matching.

11. The method of claim 1, wherein selecting at least one string comprises selecting a first string and selecting a second string, wherein, during at least part of the SoH calibration, the second string acts as an energy sink for energy discharged from the first string.

12. The method of claim 1, wherein placing the selected at least one string into the SoH calibration mode comprises:
   controlling power flow through a converter connected between the selected at least one string and a point of common coupling in accordance with a calibration load profile during the SoH calibration, and/or
   disconnecting the selected at least one string from the point of common coupling and temporarily connecting the selected at least one string to a SoH cycle energy source and/or energy sink.

13. The method of claim 1, wherein cells of the selected at least one string are charged and/or discharged in accordance with a calibration load profile during the SoH calibration.

14. The method of claim 13, wherein the calibration load profile is predetermined or operator-defined.

15. The method of claim 13, wherein the selected at least one string is charged to a first level that exceeds a first threshold and is discharged to a second level that is less than a second threshold during each successive SoH calibration cycle performed during the SoH calibration, the first threshold being 80% or more and the second threshold being 20% or less.

16. The method of claim 1, wherein maintaining the at least one other string in the operative mode comprises maintaining all strings of the plurality of parallel strings except for the selected at least one string in the operative mode.

17. The method of claim 1, wherein the plurality of parallel strings form a stationary battery energy storage system, BESS.

18. The method of claim 1, wherein the plurality of parallel strings are installed onboard a vehicle.

19. A control device for controlling a State of Health (SoH) estimation of a rechargeable battery energy storage system, wherein the rechargeable battery energy storage system comprises a plurality of parallel strings that are individually controllable, the control device comprising:
   an interface operative to be coupled to the plurality of parallel strings, and
   at least one integrated semiconductor circuit coupled to the interface and operative to:
      select at least one string from the plurality of parallel strings,
      control the rechargeable battery energy storage system to place the selected at least one string into a SoH calibration mode for a SoH calibration while concurrently maintaining at least one other string of the plurality of parallel strings in operative mode, and
      control the rechargeable battery energy storage system to cause the selected at least one string to return to operative mode after the SoH calibration has been completed for the selected at least one string.

20. A control device according to claim 19, wherein the control device is configured to successively place strings into the SoH calibration mode in an order determined by ranking and/or matching the plurality of parallel strings based on performance characteristics, in particular performance characteristics that includes a degradation indicator for each of the plurality of parallel strings.

21. A rechargeable battery energy storage system, comprising:
   a plurality of parallel strings that are individually controllable; and a control device according to claim 19 coupled to the plurality of parallel strings.

* * * * *

UNITED STATES PATENT AND TRADEMARK OFFICE
CERTIFICATE OF CORRECTION

PATENT NO. : 11,336,104 B2
APPLICATION NO. : 16/987803
DATED : May 17, 2022
INVENTOR(S) : Jan Poland It is certified that error appears in the above-identified patent and that said Letters Patent is hereby corrected as shown below:

On the Title Page

Item (73), Assignee; insert --ABB SCHWEIZ AG, Baden (CH)-- before "HITACHI ENERGY SWITZERLAND AG, Baden (CH)."

Signed and Sealed this
Twentieth Day of September, 2022

Katherine Kelly Vidal
*Director of the United States Patent and Trademark Office*